United States Patent [19]

Eime et al.

[11] 4,292,396
[45] Sep. 29, 1981

[54] METHOD FOR IMPROVING THE PRESS LIFE OF A LITHOGRAPHIC IMAGE HAVING AN OUTER LAYER COMPRISING AN EPOXY RESIN AND ARTICLE PRODUCED BY METHOD

[75] Inventors: Lester O. Eime, St. Louis County; Edward H. Parker, Ballwin, both of Mo.

[73] Assignee: Western Litho Plate & Supply Co., St. Louis, Mo.

[21] Appl. No.: 126,687

[22] Filed: Mar. 3, 1980

[51] Int. Cl.$^3$ .......................... G03F 7/00; G03F 7/08
[52] U.S. Cl. .................................... 430/302; 430/162; 430/273; 430/309; 430/331; 430/14; 430/17; 430/18; 101/456; 101/457; 101/467; 101/470
[58] Field of Search ............... 430/302, 309, 280, 331, 430/156, 162, 166, 167, 273, 14, 17, 18; 101/456, 457, 467, 470

[56] References Cited

U.S. PATENT DOCUMENTS

| | | | |
|---|---|---|---|
| 2,824,083 | 2/1958 | Parry et al. | 260/47 |
| 2,839,495 | 6/1958 | Carey | 260/47 |
| 3,222,312 | 12/1965 | Wyart | 260/30.4 |
| 3,393,178 | 7/1968 | Lynch | 260/47 |
| 3,462,267 | 8/1969 | Giangualano | 430/156 |
| 3,586,507 | 6/1971 | Burnett | 430/156 |
| 3,652,272 | 3/1972 | Thomas | 430/156 |
| 3,669,664 | 6/1972 | Adams et al. | 430/309 |
| 3,779,759 | 12/1973 | Lawson et al. | 430/331 |
| 3,790,385 | 2/1974 | Steppan et al. | 96/75 |
| 4,074,008 | 2/1978 | Green | 430/280 |
| 4,101,322 | 7/1978 | Lawson | 430/309 |

OTHER PUBLICATIONS

Chemical Abstracts, vol. 75 (1971), #21609u (Ito. et al.).
Chemical Abstracts, vol. 84 (1976), #181038w (Kurzeja et al.).
In re. Harrington et al., 161 USPQ291 (CCPA-1969), p. 291-294.
Harshaw Bulletin, "Boron Trifluoride Monoethylamine".
Hersch, "Picking the Proper Epoxy Catalyst", *Plastics Technology*, Dec. 1966.
Harris et al., "Proposed . . . Complexes", *J. of App. Polymer Science*, vol. 10., p. 523-534 (1966).

*Primary Examiner*—Charles L. Bowers, Jr.
*Attorney, Agent, or Firm*—Senniger, Powers, Leavitt and Roedel

[57] ABSTRACT

A method of increasing the strength, abrasion resistance, solvent resistance, and press life of a lithographic image comprising a layer of light-reacted light sensitive material and an outer layer comprising an epoxy resin overlying the light-reacted layer. In the method, the surface of the outer layer is contacted and wetted with an aqueous solution comprising a least about 7% by weight of a boron trifluoride-amine complex. Solvent is evaporated from the solution on the surface to deposit dry boron trifluoride-amine complex on the outer layer and the outer layer is heated in the presence of the complex to cross-link the epoxy resin and form a hard, tough, abrasion-resistant, solvent-resistant and wear-resistant epoxy resin layer at the outside of the image. Further included in the invention are a curing composition adapted for topical application to a lithographic image in carrying out the method of the invention and a planographic printing plate produced thereby.

11 Claims, No Drawings

METHOD FOR IMPROVING THE PRESS LIFE OF A LITHOGRAPHIC IMAGE HAVING AN OUTER LAYER COMPRISING AN EPOXY RESIN AND ARTICLE PRODUCED BY METHOD

BACKGROUND OF THE INVENTION

This invention relates to the field of lithographic printing and more particularly to an improved method for increasing the abrasion and wear-resistance of lithographic plates by providing a tough, durable, solvent resistant layer at the outside of a lithographic image.

Images obtained from the exposure and development of conventional lithographic light-sensitive materials are often relatively fragile and consequently abrade and deteriorate relatively rapidly under printing conditions. Diazo resin sensitizers, for example, such as those produced by condensation of formaldehyde and diazodiphenylamine, provide sharp images and enjoy substantial commercial success, but the images are quite fragile and not well adapted for long run printing operations.

In order to impart improved image toughness for diazo resin sensitized plates, "additive" or lacquer developers are commonly used. Such developers contain a resin component which coats out over the image upon development of the plate to provide an overcoating having a significantly greater toughness than that exhibited by the light-exposed diazo resin. A variety of organic resins including polyvinyl chloride have been utilized in lacquer developers. Currently, however, epoxy resins, particularly those derived from epichlorohydrin and bisphenol A are most commonly used as the resin component of a lacquer developer. Certain of the commercially available lacquer developers are emulsions which contain both organic solvents as a vehicle for the epoxy resins and acids for desensitization of the underlying substrate in the areas not exposed to light.

Epoxy resins have also been utilized as overcoatings over diazo resin sensitizing coatings in so-called "subtractive" lithographic plates. Such a plate is described, for example, in Larson U.S. Pat. No. 3,136,637. These plates are referred to as "subtractive" because the resin overcoating which imparts improved durability to the plate is present on the plate before exposure, and development involves mere removal of light-sensitive and overcoating material in the unexposed portions of the plate without any addition to the image of components deposited from the developer.

Although epoxy and other resin overcoatings are widely utilized and generally effective to impart improved durability to lithographic images, the strength and effectiveness of epoxy coatings is limited by the relatively low molecular weight thereof. In order to permit the application of epoxy resin in an additive lacquer developer or to permit removal of the epoxy upon development of a subtractive plate such as that described in the aforesaid Larson patent, it is necessary that the resin be of relatively low molecular weight. As a result, the durability of the epoxy film at the image surface is limited by the physical cohesive forces of the resin molecules as the epoxy congeals into a film upon evaporation of the solvent vehicle from which it is applied. Such films do not exhibit the toughness, durability and abrasion resistance of a cross-linked epoxy resin material. Moreover, such low molecular weight resins are subject to attack by strong solvents such as cyclohexanone, ethylene glycol alkyl ethers, acrylic monomers and toluene. Thus, images provided with epoxy resin surface coatings are subject to deterioration on exposure to strong solvents contained in blanket and roller washes and in certain inks, for example, the U.V. curable inks that contain acrylic monomers.

SUMMARY OF THE INVENTION

Among the several objects of the present invention, therefore, may be noted the provision of a method for increasing the strength of a lithographic image having an outer layer comprising an epoxy resin; the provision of such a method which produces a plate of improved abrasion resistance; the provision of such a method which produces a plate of improved wear resistance; the provision of such a method which produces a plate of improved resistance to solvents, most particularly to the strong solvents utilized in blanket washes, roller washes, and certain ultraviolet curable printing inks; and the provision of an improved planographic printing plate that may be produced by such method.

Briefly, therefore, the present invention is directed to a method of increasing the strength, abrasion resistance, solvent resistance and press life of a lithographic image comprising a layer of light-reacted light sensitive material and an outer layer comprising an epoxy resin. In the method, the surface of the outer layer is contacted and wetted with an aqueous solution comprising at least about 7% by weight of a boron trifluoride-amine complex. Solvent is evaporated from the solution on the surface of the outer layer to deposit a dry boron trifluoride-amine complex on the outer layer. The outer layer is heated in the presence of the complex to cross-link the epoxy resin and form a hard, tough, abrasion-resistant, solvent-resistant epoxy resin layer at the outside of the image The invention is further directed to a planographic printing plate comprising a substrate having a water-wettable hydrophilic surface. Over the hydrophilic surface is a printing image defined by a coating comprising a layer comprising a light-reacted light sensitive layer and overlying said light-reacted layer an outer oleophilic ink-receptive layer comprising an epoxy resin cross-linked by heating in the presence of a topically applied boron trifluoride-amine complex. The cross-linked epoxy resin layer imparts strength, abrasion-resistance, solvent-resistance and press wear-resistance to the plate.

Also included in the invention is a curing composition adapted for topical application to a lithographic image having an epoxy resin coating at the outside thereof. The composition comprises at least about 7% by weight of a boron trifluoride-amine complex in an aqueous solvent system. The solvent system comprises between about 20% and about 80% by weight, solvent basis, of an organic solvent that is miscible with water and in which the epoxy resin is substantially insoluble.

Other objects and features will be in part apparent and in part pointed out hereinafter.

DESCRIPTION OF THE PREFERRED EMBODIMENTS

In accordance with the present invention, it has been discovered that the epoxy resin coating provided at the outside of a lithographic image by development with an add-on developer can be cross-linked to provide a tough, durable, solvent resistant image by topical application of a solution of a boron trifluoride-amine complex, followed by drying and heating to a temperature effective to cause the cross-linking reaction in the presence of the complex. Working as it does by mere topical application of the solution of the boron trifluoride-amine complex, the method of the invention provides a highly practical technique for the printer to achieve substantial improvement in the press wear properties and solvent resistance properties of the plate. The practicality of the method is further enhanced by the lack of any necessity for careful control of the quantities of boron trifluoride-amine complex applied over the surface of the epoxy prior to heating for effecting of the cross-linking reaction.

The method of the invention is applicable not only to the epoxy resin layer deposited from lacquer developers but also to a preapplied epoxy resin layer of the type described in the aforesaid Larson patent. In either instance, topical application and subsequent drying and heating provide extensive cross-linking which renders the cured epoxy resin layer resistant to solvents such as cyclohexanone, ethylene glycol alkyl ethers, toluene, benzene and acrylic monomers. Accordingly, not only are the mechanical press wear characteristics of the plate markedly improved, but the epoxy layer is resistant to deterioration when it is exposed to blanket washes, roller washes, ink solvents, etc.

Boron trifluoride-amine complexes are generally effective for curing a variety of epoxy resins. Most preferably, the resins comprising the epoxy coating on the lithographic image include resins derived from epichlorohydrin A.

A preferred boron trifluoride complex is boron trifluoride monoethylamine. However, a variety of other boron trifluoride-amine complexes can be utilized, including boron trifluoride-aniline, boron trifluoride-2,6-diethylaniline, boron trifluoride-disecondary-butylamine, and boron trifluoride-N-dimethyl aniline. Generally, it is preferred to use a boron trifluoride-amine complex which provides curing of the epoxy resin at a temperature below 475° F. Where the substrate of the lithographic plate is aluminum, as is most commonly the case, temperatures above 500° F. should be avoided to prevent annealing of the aluminum.

As noted above, the boron trifluoride-amine complex is applied topically to a lithographic image at the surface of an outer layer of epoxy resin overlying a light-reacted light sensitive layer. Application is by way of an aqueous solution which should contain at least about 7% by weight, preferably about 10% by weight, of the amine complex. Preferably the application solution also contains an organic solvent that is miscible with water and promotes wetting the surface of the epoxy coating on the outside of the lithographic image, but in which the epoxy resin is substantially insoluble so that no attack of the image is suffered. A suitable component meeting these criteria is ethylene glycol which promotes even distribution of the boron trifluoride complex over the surface of the epoxy coating, not only through its wetting effect but also by retarding the rate of drying of the vehicle. It is generally preferred that the organic solvent have a volatility less than water or form a high boiling azeotrope therewith, so that the volatility of the aqueous solvent system is less than that of water.

A wide range of proportions of organic solvent and water may be used in the vehicle. Thus, the curing composition of the invention contains at least about 7% by weight boron trifluoride-amine complex and comprises an aqueous solvent system which contains between about 20% and about 80% by weight, solvent basis, of the aforesaid organic solvent.

In accordance with the method of the invention, a lithographic plate sensitized, for example, with a diazodiphenylamine/formaldehyde resin sensitizer is exposed and developed in a conventional fashion utilizing a lacquer emulsion developer containing an epoxy resin; for example, one derived from epichlorohydrin and bisphenol A. After development of the plate, the lithographic image obtained is wiped with an aqueous solution containing the boron trifluoride-amine complex thereby wetting the surface of the epoxy layer with the solution. Solvent is then evaporated, preferably under heating, to deposit dry amine complex on the epoxy layer after which the epoxy coating is heated in the presence of the amine complex at a temperature of at least about 220° F., most typically 280° to 320° F., for a period of approximately 20 sec. to several minutes. The same application and treatment procedure may be followed with a subtractive plate having an epoxy resin overcoating of the type described in Larson U.S. Pat. No. 3,136,637.

Despite the fact that the boron trifluoride-amine complex is not incorporated in the epoxy resin as initially applied to the plate, thorough curing of the thin epoxy film is achieved, apparently through diffusion of the amine complex through the outer layer.

A planographic printing plate produced in accordance with the invention comprises a substrate having a water-wettable hydrophilic surface; for example, aluminum or anodized aluminum that has been treated or sealed with an alkali metal silicate. Over the hydrophilic surface is a printing image defined by a coating comprising two layers. One layer comprises a light-reacted light sensitive material such as a diazo resin. Overlying the light-reacted layer is an outer oleophilic ink-receptive layer that is produced in the manner described above. Thus, the outside layer comprises an epoxy resin cross-linked by heating in the presence of a topically applied boron trifluoride-amine complex. The planographic plate of the invention possesses superior strength, abrasion-resistance, solvent-resistance and press wear resistance.

The following examples illustrate the invention:

EXAMPLE 1

A lithographic plate having an anodized and silicated aluminum base sensitized with a condensation product of p-diazodiphenylamine and formaldehyde was exposed to actinic light through a photographic negative and developed with a lacquer developer sold under the trade designation "Dispatch Black Lacquer" by Lith-Kem-Co., Inc. of Lynbrook, N.Y. This processing resulted in the formation of a lithographic image having an epoxy resin layer overlying the light-reacted diazo resin. The outer layer was determined by infrared spectrophotometry to comprise a low molecular weight epichlorohydrin/bisphenol A epoxy resin.

The surface of the plate was wiped with an aqueous solution containing 10% by weight boron trifluoride monoethylamine in a vehicle which comprised 25% by weight water and 75% by weight ethylene glycol. The plate was then heated to evaporate the solvent and heating was continued in the presence of the boron trifluoride monoethylamine catalyst at approximately 280° F. to 330° F. over a two minute period. After curing was completed, the plate was heated to a temperature of 400° F. without any evidence of decomposition of the amine complex.

EXAMPLE 2

A lithographic plate of the type described in Example 1 was exposed and developed in the manner therein described using a lacquer emulsion developer sold under the trade designation "Sure Dot Wipe-On Developer" by RBP Chemical Corporation. Infrared spectrophotometry established that the epoxy resin coating obtained on the surface of the lithographic image was a low molecular weight resin derived from epichlorohydrin and bisphenol A. The developed plate was wiped with a curing solution of the type described in Example 1 and heated to drive off solvent and polymerize the epoxy resin. Polymerization commenced at approximately 400° F. and was completed at approximately 480° F. No thermal decomposition of the amine complex was observed.

EXAMPLE 3

A lithographic plate of the type described in Example 1 was exposed and developed in the manner described therein utilizing an epoxy lacquer emulsion developer sold under the trade designation "Red Granite Developer" by Western Litho Plate. The developed image was wiped with the boron trifluoride monoethylamine solution described in Example 1, the solvent evaporated and the epoxy resin thereafter polymerized. Polymerization began at a temperature of about 280° F. and was essentially complete at 420° F.

EXAMPLE 4

Utilizing the method described in Example 1, a lithographic plate of the type described therein was exposed and developed using an epoxy lacquer emulsion developer sold under the trade designation "Blue Gem Developer" by Western Litho Plate. The developed plate was treated with boron trifluoride monoethylamine solution as described in Example 1 and heated to drive off the solvent. Heating was continued to polymerize the epoxy resin. Initial polymerization commenced at about 230° F. and was complete at about 240° F.

In view of the above, it will be seen that the several objects of the invention are achieved and other advantageous results attained.

As various changes could be made in the above methods and products without departing from the scope of the invention, it is intended that all matter contained in the above description shall be interpreted as illustrative and not in a limiting sense.

What is claimed is:

1. A method of increasing the strength, abrasion-resistance, solvent-resistance and press life of a lithographic image of a lithographic plate comprising said image over a substrate having a water-wettable hydrophilic surface, said image comprising a layer of light-reacted light sensitive material and an outer layer comprising an epoxy resin overlying said light-reacted layer, the method comprising the steps of:
    contacting and wetting the surface of said outer layer with an aqueous solution comprising at least about 7% by weight of a boron trifluoride-amine complex;
    evaporating solvent from said solution on said surface to deposit dry boron trifluoride-amine complex on said outer layer; and
    heating said outer layer in the presence of said complex to cross-link said epoxy resin and form a hard, tough abrasion-resistant, solvent-resistant and wear-resistant epoxy resin layer at the outside of said image.

2. A method as set forth in claim 1 wherein said resin outer layer is present at the outside of said image as a result of application of an epoxy lacquer over the light reacted light sensitive layer after exposure of said plate.

3. A method as set forth in claim 2 wherein said image is produced by exposure of a lithographic coating containing a light-sensitive negative acting diazo resin to light through a photographic negative and thereafter contacting the lithographic coating with a lacquer developer containing said epoxy resin and a solvent for the unexposed diazo resin, whereby diazo resin is removed from the nonimage areas and a coating comprising said epoxy resin is formed over the light-reacted lithographic coating in the image areas.

4. A method as set forth in claim 1 wherein the solvent component of said aqueous solution comprises both water and an organic solvent which is miscible with water and in which said epoxy resin is substantially insoluble.

5. A method as set forth in claim 4 wherein said organic solvent comprises ethylene glycol.

6. A method as set forth in claim 4 wherein the proportion of said organic solvent in said aqueous solution is sufficient to promote wetting of the surface of said epoxy resin layer and evenly distribute said amine complex thereover.

7. A method as set forth in claim 1 wherein said complex is selected from the group consisting of boron trifluoride-monoethylamine, boron trifluorideaniline, boron trifluoride-2,6-diethylaniline, boron trifluoride-di-sec-butylamine, and boron trifluoride-N-dimethylaniline.

8. A method as set forth in claim 7 wherein said complex comprises boron trifluoride-monoethylamine.

9. A method as set forth in claim 8 wherein said solution contains approximately 10% by weight of boron trifluoride-monoethylamine.

10. A method as set forth in claim 7 wherein said epoxy resin coating is heated at a temperature of at least about 220° F. for a time sufficient to effect cross-linking.

11. A planographic printing plate comprising a substrate having a water-wettable hydrophilic surface and over said hydrophilic surface a printing image defined by a coating comprising a layer comprising a light-reacted light sensitive layer and overlying said light-reacted layer an outer oleophilic ink-receptive layer comprising an epoxy resin cross-linked by heating in the presence of a topically applied boron trifluoride-amine complex, said outer layer imparting strength, abrasion resistance, solvent resistance and press wear resistance to said plate.

* * * * *